United States Patent
Liu et al.

(10) Patent No.: US 6,791,126 B2
(45) Date of Patent: Sep. 14, 2004

(54) HETEROJUNCTION BIPOLAR TRANSISTOR WITH ZERO CONDUCTION BAND DISCONTINUITY

(75) Inventors: Wen-Chau Liu, Tainan (TW); Shiou-Ying Cheng, Taipei Hsien (TW)

(73) Assignee: National Cheng Kung University, Tainan (TW)

( * ) Notice: Subject to any disclaimer, the term of this patent is extended or adjusted under 35 U.S.C. 154(b) by 0 days.

(21) Appl. No.: 10/449,941

(22) Filed: May 30, 2003

(65) Prior Publication Data
US 2003/0222278 A1 Dec. 4, 2003

(30) Foreign Application Priority Data
Jun. 4, 2002 (TW) .................................. 091111960 A

(51) Int. Cl.⁷ ........................................ H01L 31/0328
(52) U.S. Cl. ................... 257/197; 257/183; 257/185; 257/191; 257/197; 438/235; 438/309; 438/312
(58) Field of Search ............................ 257/183, 185, 257/191, 197; 438/235, 309, 312

(56) References Cited
U.S. PATENT DOCUMENTS

| | | | | |
|---|---|---|---|---|
| 5,010,382 A | * | 4/1991 | Katoh | .......................... 257/15 |
| 5,284,783 A | * | 2/1994 | Ishikawa et al. | ............... 117/84 |
| 5,631,477 A | * | 5/1997 | Streit et al. | .................. 257/197 |
| 5,648,666 A | * | 7/1997 | Tran et al. | .................... 257/197 |
| 5,721,437 A | * | 2/1998 | Twynam et al. | ............. 257/197 |
| 6,399,969 B1 | * | 6/2002 | Twynam | ...................... 257/191 |
| 6,667,498 B2 | * | 12/2003 | Makimoto et al. | .......... 257/183 |

* cited by examiner

Primary Examiner—Allan R. Wilson
Assistant Examiner—Edgardo Ortiz
(74) Attorney, Agent, or Firm—Ohlandt, Greeley, Ruggiero & Perle, L.L.P.

(57) ABSTRACT

A bipolar heterojunction transistor (HBT) includes a collector layer, a base layer formed on the collector layer, a first transition layer formed on the base layer, an emitter layer formed on the first transition layer, a second transition layer formed on the emitter layer, and an emitter cap layer formed on the second transition layer. Each of the first and second transition layers is formed of a composition that contains an element, the mole fraction of which is graded in such a manner that the conduction band of the HBT is continuous through the base layer, the first and second transition layers, the emitter layer and the emitter cap layer.

16 Claims, 8 Drawing Sheets

US 6,791,126 B2

HETEROJUNCTION BIPOLAR TRANSISTOR WITH ZERO CONDUCTION BAND DISCONTINUITY

CROSS-REFERENCE TO RELATED APPLICATION

This application claims priority of Taiwanese application No. 091111960, filed on Jun. 4, 2002.

BACKGROUND OF THE INVENTION

1. Field of the Invention

This invention relates to a heterojunction bipolar transistor, more particularly to a heterojunction bipolar transistor with zero conduction band discontinuity.

2. Description of the Related Art

Recent developments in the field of heterojunction bipolar transistors (HBT) focused primarily on high-speed, lower power consumption, low turn-on voltage, low compensation voltage, high breakdown voltage, high linearity, and high frequency analog and digital circuit applications. FIG. 1 illustrates a conventional GaAs-based HBT, such as AlGaAs/GaAs or InGaP/GaAs HBT, that normally includes a semiconductor (otherwise known as semi-insulating material) GaAs substrate layer 11, a GaAs buffer layer 12 formed on the substrate layer 11, a GaAs collector layer 13 formed on the buffer layer 12, a GaAs base layer 14 formed on the collector layer 13, an AlGaAs or InGaP emitter layer 15 formed on the base layer 14, and an emitter cap layer 16 formed on the emitter layer 15. The conventional HBT is advantageous in that (1) the use of wide energy band AlGaAs or InGaP for making the emitter layer 15 can effectively reduce injection of minority carriers from the base layer 14 into the emitter layer 15, which, in turn, can increase the injection efficiency of the emitter layer 15, (2) that a relatively high doping concentration in the base layer 14 is permitted, which can significantly reduce the resistance of the base layer 14 and which can considerably increase punch-through voltage, and (3) that a lower doping concentration in the emitter layer 15 is permitted, which can effectively reduce capacitance between the emitter layer 15 and the base layer 14, which, in turn, is advantageous for high frequency response applications. With the advantages as mentioned above, the conventional HBT is particularly suitable for use in microwave power amplifier applications and high frequency voltage controlled oscillator applications. In addition, as compared with the InP-based HBT, the GaAs-based HBT has higher production yield and reliability and involves lower manufacturing costs.

However, the conventional GaAs-based HBT is disadvantageous in that, when under a biased condition, an undesired potential spike occurs due to the presence of conduction band discontinuities ($\Delta E_c$) at junctions 18, 17 (see FIG. 2) between the emitter layer 15 and the base layer 14 and between the emitter layer 15 and the emitter cap layer 16 upon actuation of the HBT, which can deteriorate the performance of the HBT, such as a decrease in the emission efficiency and in the collector current, and an increase in the recombination current, in the base-to-emitter turn-on voltage, and in the collector-to-emitter compensation voltage. The aforesaid undesired effects are particularly severe under low working current conditions.

SUMMARY OF THE INVENTION

Therefore, the object of the present invention is to provide a heterojunction bipolar transistor that is capable of overcoming the aforesaid drawbacks of the prior art.

According to the present invention, there is provided a heterojunction bipolar transistor that comprises: a collector; a base layer formed on the collector; a first transition layer formed on the base layer; an emitter layer formed on the first transition layer; a second transition layer formed on the emitter layer; and an emitter cap layer formed on the second transition layer. Each of the first and second transition layers is formed of a composition that contains an element. The element of the composition of the first transition layer varies decreasingly in mole fraction from one side of the first transition layer, which is adjacent to the emitter layer, to an opposite side of the first transition layer, which is adjacent to the base layer. The element of the composition of the second transition layer varies decreasingly in mole fraction from one side of the second transition layer, which is adjacent to the emitter layer, to an opposite side of the second transition layer, which is adjacent to the emitter cap layer, so as to form a continuous conduction band from the base layer, through the first transition layer, the emitter layer and the second transition layer, to the emitter cap layer.

BRIEF DESCRIPTION OF THE DRAWINGS

In drawings which illustrate an embodiment of the invention.

DETAILED DESCRIPTION OF THE PREFERRED EMBODIMENT

Figure 1:
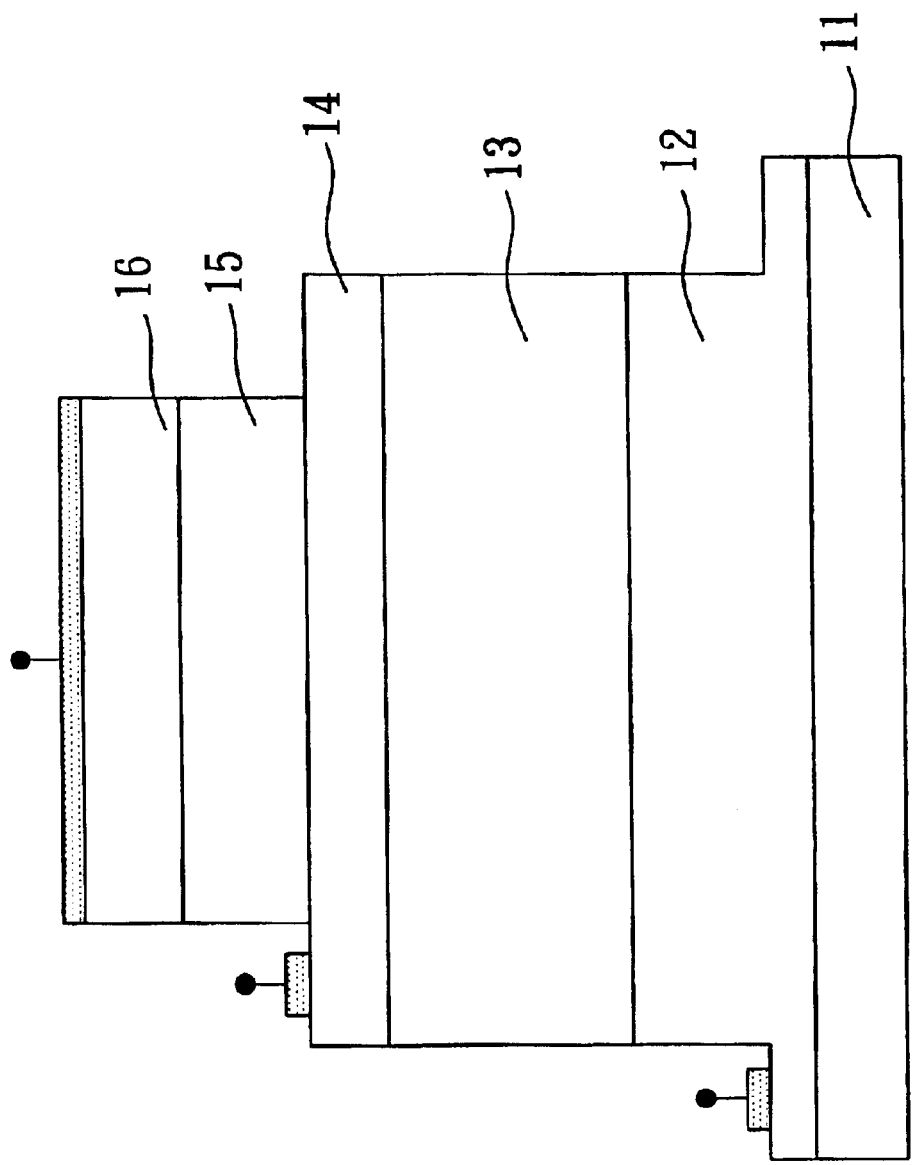
FIG. 1 is a schematic view of a conventional heterojunction bipolar transistor.
Figure 2:
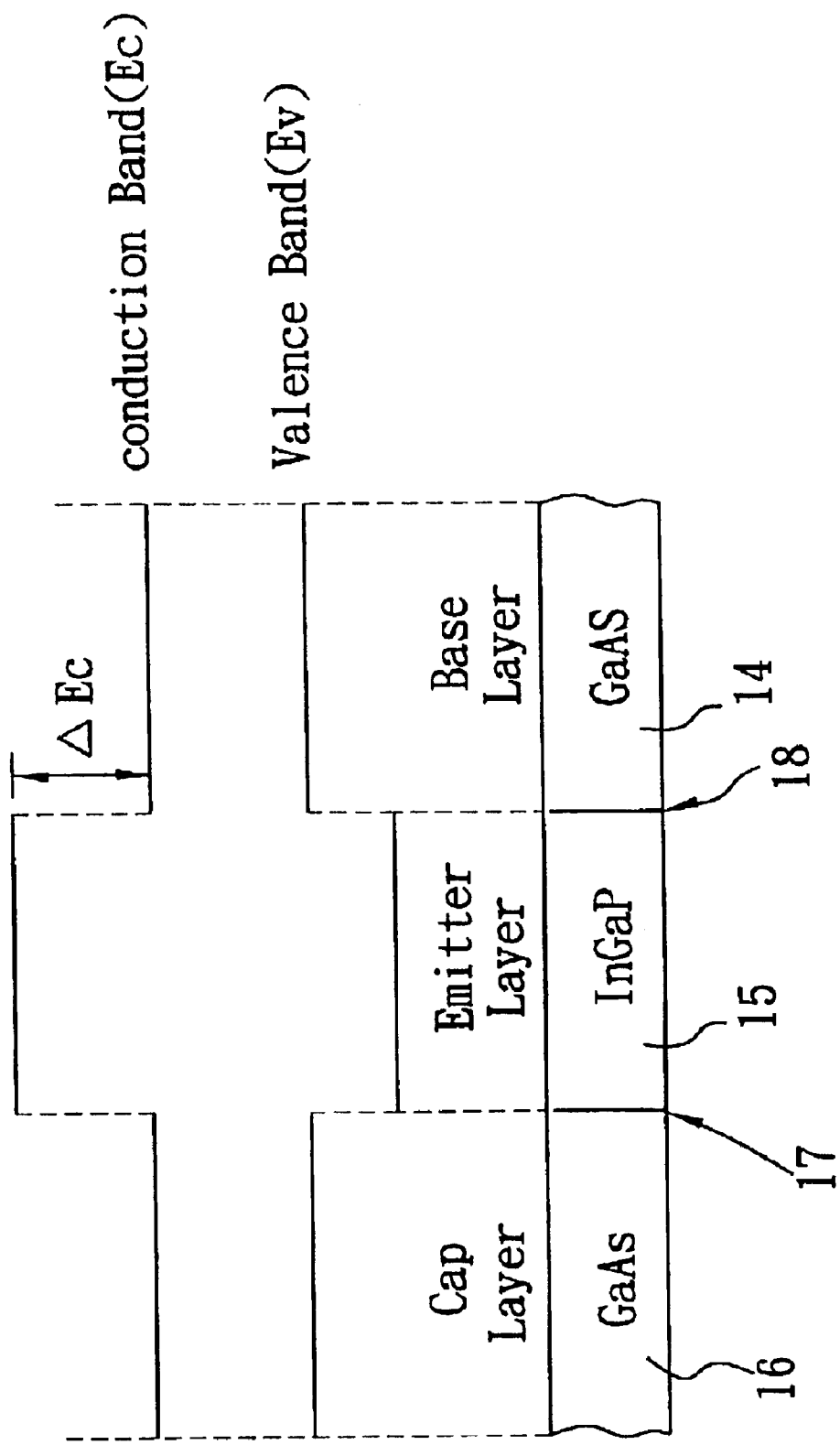
FIG. 2 is a schematic view of the conduction band ($E_c$) and the valence band ($E_v$) of the heterojunction bipolar transistor of FIG. 1.
Figure 3:
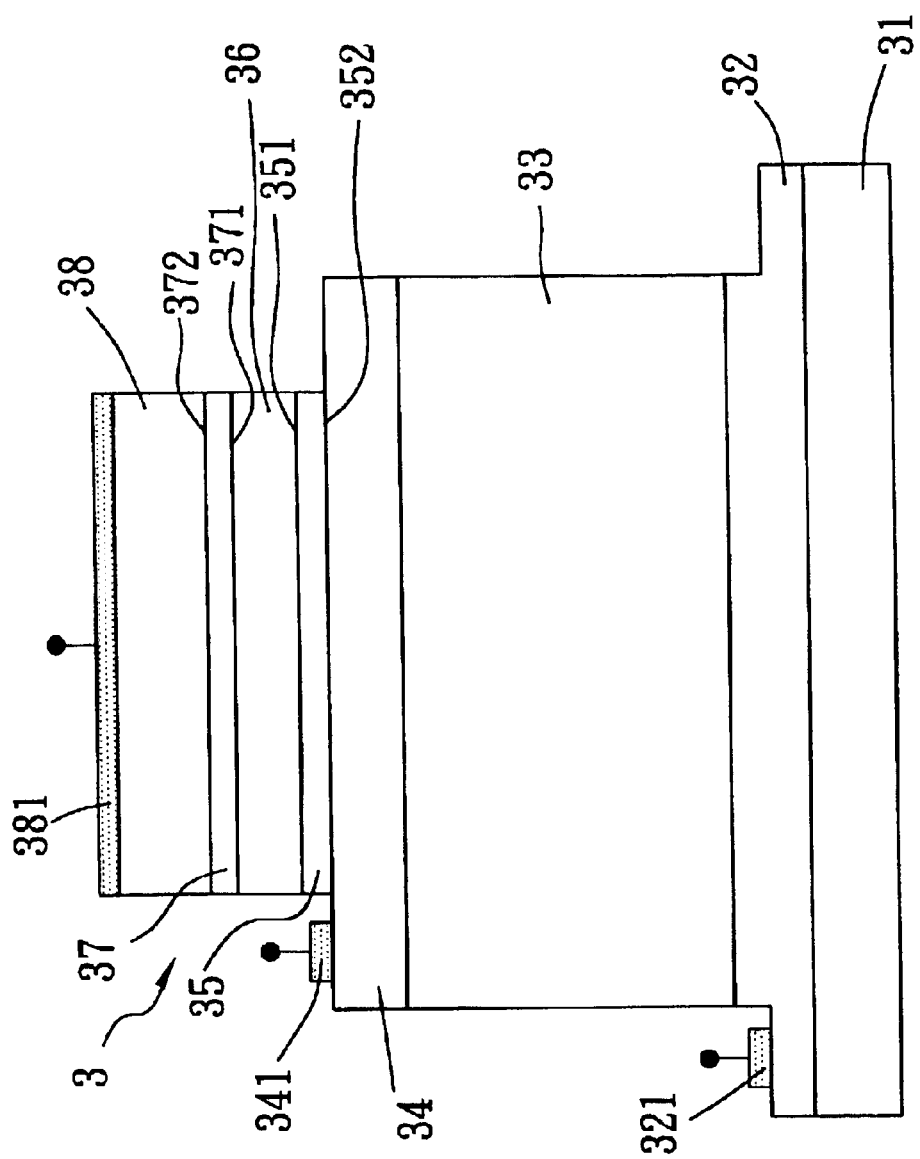
FIG. 3 is a schematic view of the preferred embodiment of a heterojunction bipolar transistor according to the present invention.
Figure 4:
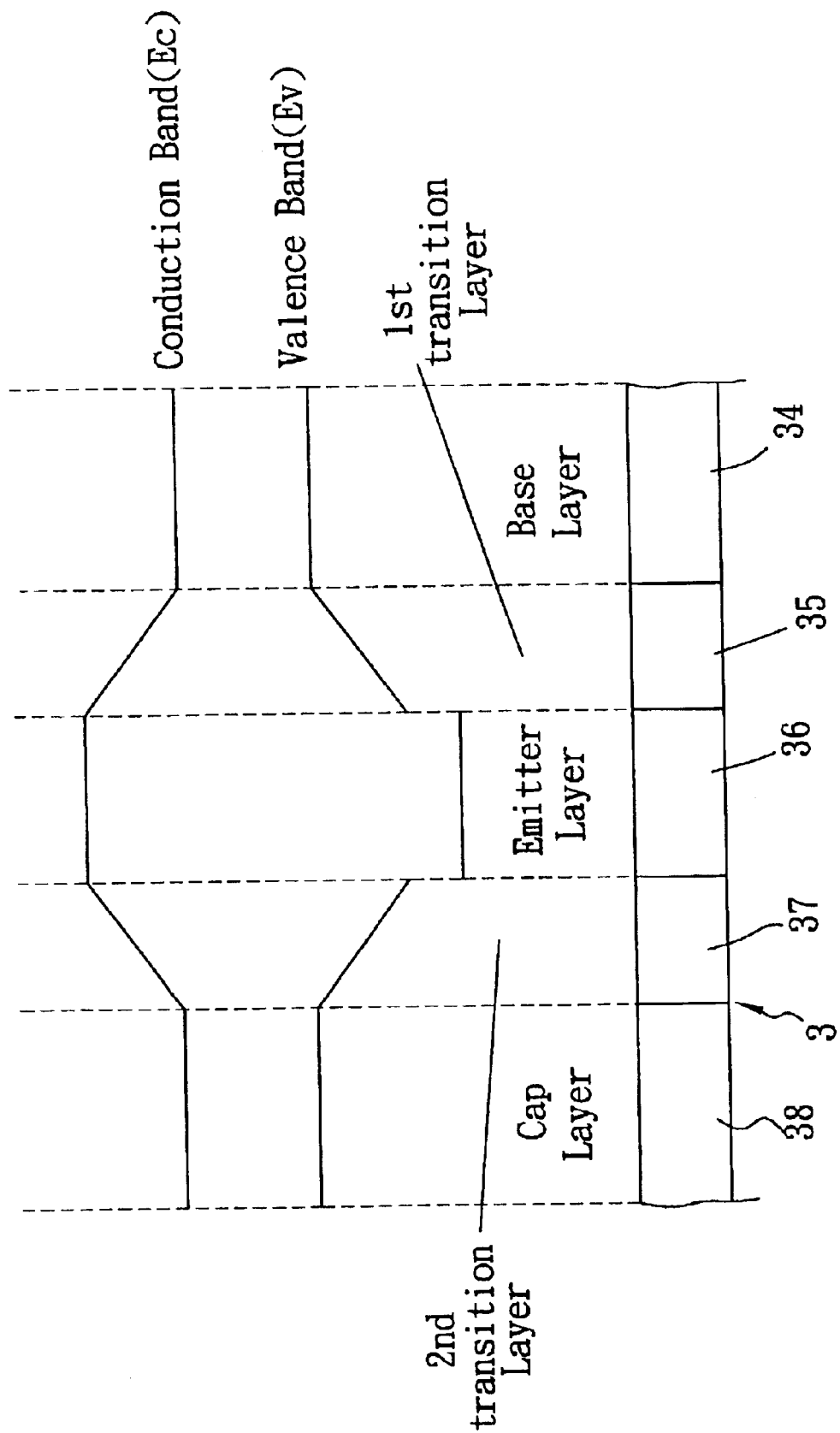
FIG. 4 is a schematic view of the conduction band ($E_c$) and the valence band ($E_v$) of the preferred embodiment of this invention.

FIG. 3 illustrates the preferred embodiment of a heterojunction bipolar transistor (HBT) 3 according to this invention. The heterojunction bipolar transistor 3 includes: a GaAs semi-insulating substrate layer 31; a GaAs buffer layer 32 formed on the substrate layer 31; a GaAs collector layer 33 formed on the buffer layer 32; a collector electrode 321 formed on the buffer layer 32; a GaAs base layer 34 formed on the collector layer 33; a base electrode 341 formed on the base layer 34; a first transition layer 35 formed on the base layer 34; an emitter layer 36 formed on the first transition layer 35; a second transition layer 37 formed on the emitter layer 36; a GaAs emitter cap layer 38 formed on the second transition layer 37; and an emitter electrode 381 formed on the cap layer 38. Each of the first and second transition layers 35, 37 is formed of a composition that contains an element. The element of the composition of the first transition layer 35 varies decreasingly in mole fraction from one side 351 of the first transition layer 35, which is adjacent to the emitter layer 36, to an opposite side 352 of the first transition layer 35, which is adjacent to the base layer 34. The element of the composition of the second transition layer 37 varies decreasingly in mole fraction from one side 371 of the second transition layer 37, which is adjacent to the emitter layer 36, to an opposite side 372 of the second transition layer 37, which is adjacent to the emitter cap layer 38, so as to form a continuous conduction band ($E_c$) from the base layer 34, through the first transition layer 35, the emitter layer 36 and the second transition layer 37, and the emitter cap layer 38 (see FIG. 4).

In the preferred embodiment of this invention, the emitter layer 36 is made from InGaP, and the first and second transition layers 35, 37 are made from $Al_XGa_{1-X}As$, in which X is the mole fraction of Aluminum that defines the mole fraction of the aforesaid element of the composition. The mole fraction (X) is preferably linearly or non-linearly (such as parbolically) graded from 0.11 to about zero from the side 351 of the first transition layer 35 to the opposite side 352 of the first transition layer 35 and from the side 371 of the second transition layer 37 to the opposite side 372 of the second transition layer 37.

In the preferred embodiment of this invention, the substrate layer 31 is n-type GaAs, the buffer layer 32 has a thickness ranging from 10 to 1000 nm and is n-type GaAs with a dopant concentration ranging from $1\times10^{16}$ to $5\times10^{19}$ cm$^{-3}$, the collector layer 33 has a thickness ranging from 100 to 1000 nm and is n-type GaAs with a dopant concentration ranging from $1\times10^{16}$ to $5\times10^{17}$ cm$^{-3}$, the base layer 34 has a thickness ranging from 10 to 300 nm and is p-type GaAs with a dopant concentration ranging from $1\times10^{18}$ to $9\times10^{19}$ cm$^{-3}$, the first transition layer 35 has a thickness ranging from 1 to 100 nm and is n-type AlGaAs with a dopant concentration ranging from $1\times10^{17}$ to $9\times10^{18}$ cm$^{-3}$, the emitter layer 36 has a thickness ranging from 10 to 1000 nm and is n-type InGaP with a dopant concentration ranging from $1\times10^{17}$ to $9\times10^{18}$ cm$^{-3}$, the second transition layer 37 has a thickness ranging from 1 to 100 nm and is n-type AlGaAs with a dopant concentration ranging from $1\times10^{17}$ to $9\times10^{18}$ cm$^{-3}$, and the emitter cap layer 38 has a thickness ranging from 10 to 1000 nm and is n-type GaAs with a dopant concentration ranging from $1\times10^{17}$ to $9\times10^{19}$ cm$^{-3}$.

Preferably, the collector electrode 321 and the emitter electrode 381 are made from a conductive material that is selected from a group consisting of Au, Ni, Au—Ge, and Au—Ge—Ni, and the base electrode 341 is composed of a Ti/Pt/Au triple-layer.

The HBT of this invention is capable of obtaining excellent properties, such as a high working speed (greater than 10 GHz), a low working voltage (less than 1.5 V), a low compensation voltage (less than 50 mV), a low turn-on voltage (less than 1.2V), and a low knee voltage (less than 0.3V).

FIGS. 5 to 8 illustrate the unexpectedly better results of this invention over the prior art.

Figure 5:
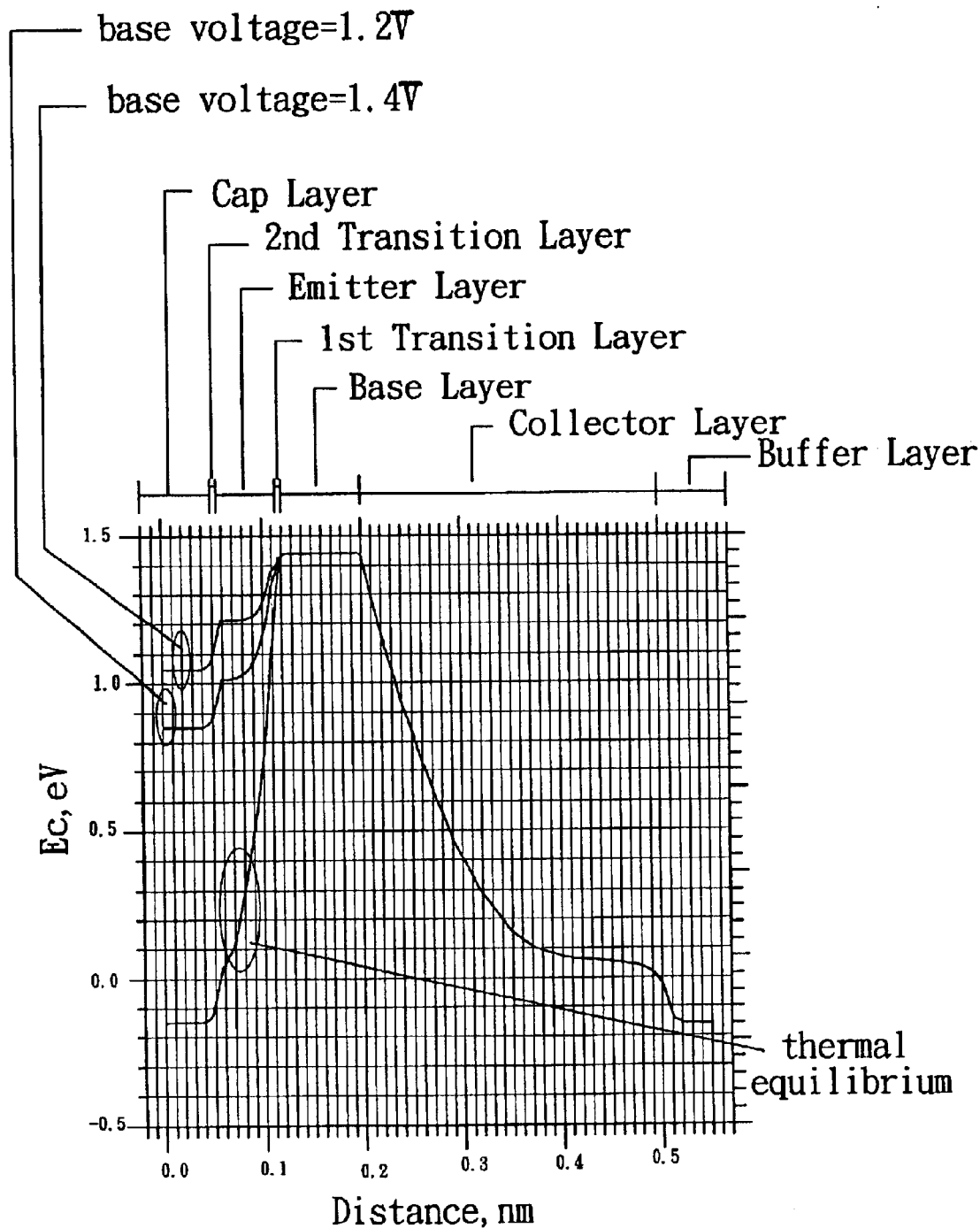
FIG. 5 is a diagram showing the conduction bands of the preferred embodiment of this invention under 1.2 V and 1.4 V base-to-emitter biased voltages and thermal equilibrium conditions.

FIG. 5 shows the measured conduction bands ($E_c$) of the HBT 3 of this invention under 1.2 V and 1.4 V base-to-emitter biased voltages and thermal equilibrium conditions. Each measured conduction band ($E_c$) is a continuous curve through the emitter cap layer 38, the first and second transition layers 35, 37, the emitter layer 36, and the base layer 34.

Figure 6:
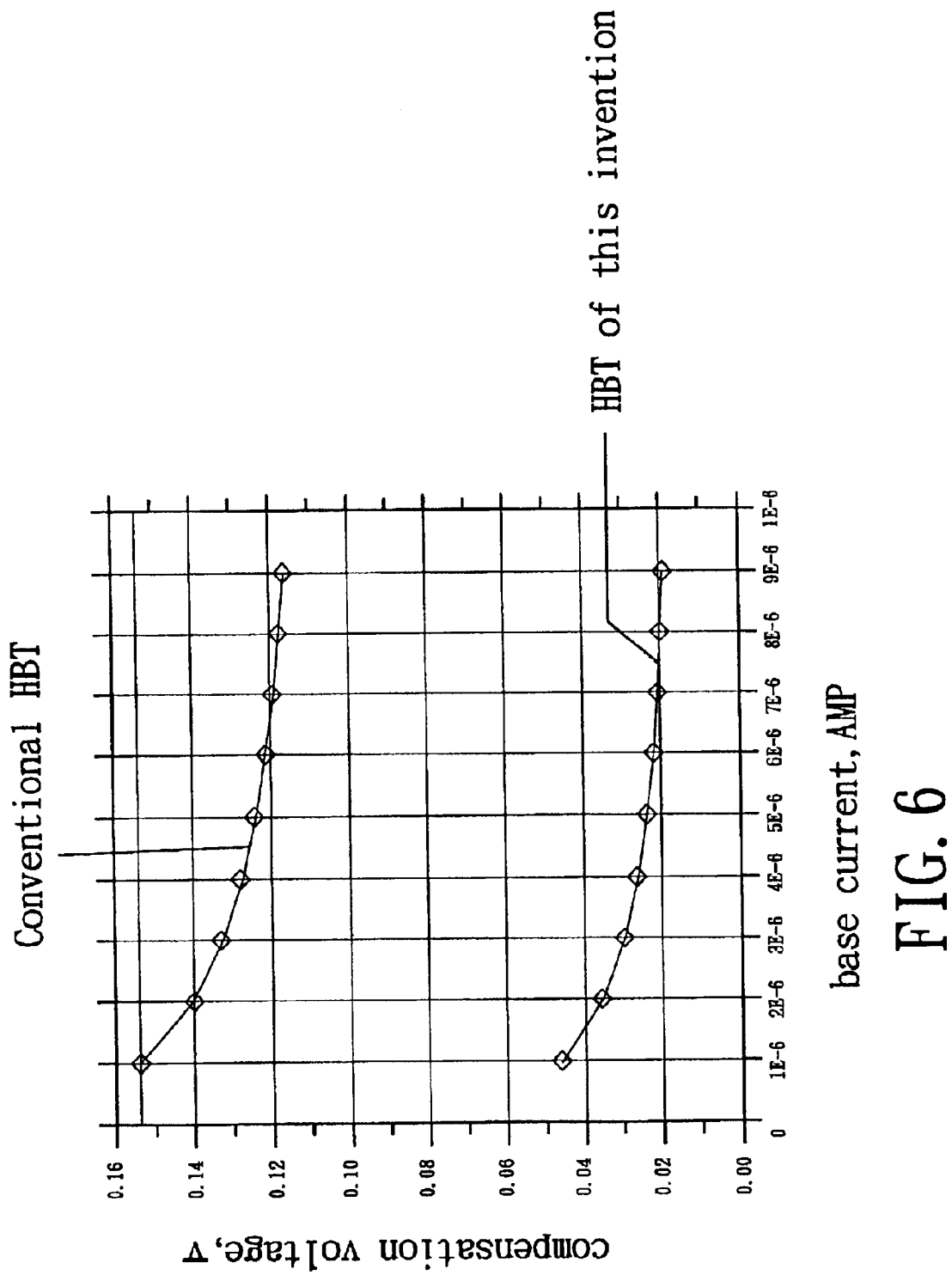
FIG. 6 is an I–V characteristics diagram showing collector-to-emitter compensation voltage versus base current for the HBT of the preferred embodiment of this invention and the conventional HBT.

FIG. 6 is an I–V characteristics diagram for comparing the compensation voltage of the HBT 3 of the preferred embodiment of this invention with that of the conventional InGaP/GaAs HBT under different base currents. The HBT 3 of this invention has a compensation voltage ranging from about 20 to 50 mV under a base current ranging from $1\times10^{-6}$ to $9\times10^{-6}$ Amp, which is much less than that of the conventional HBT (that ranges from about 120 to 150 mV).

Figure 7:
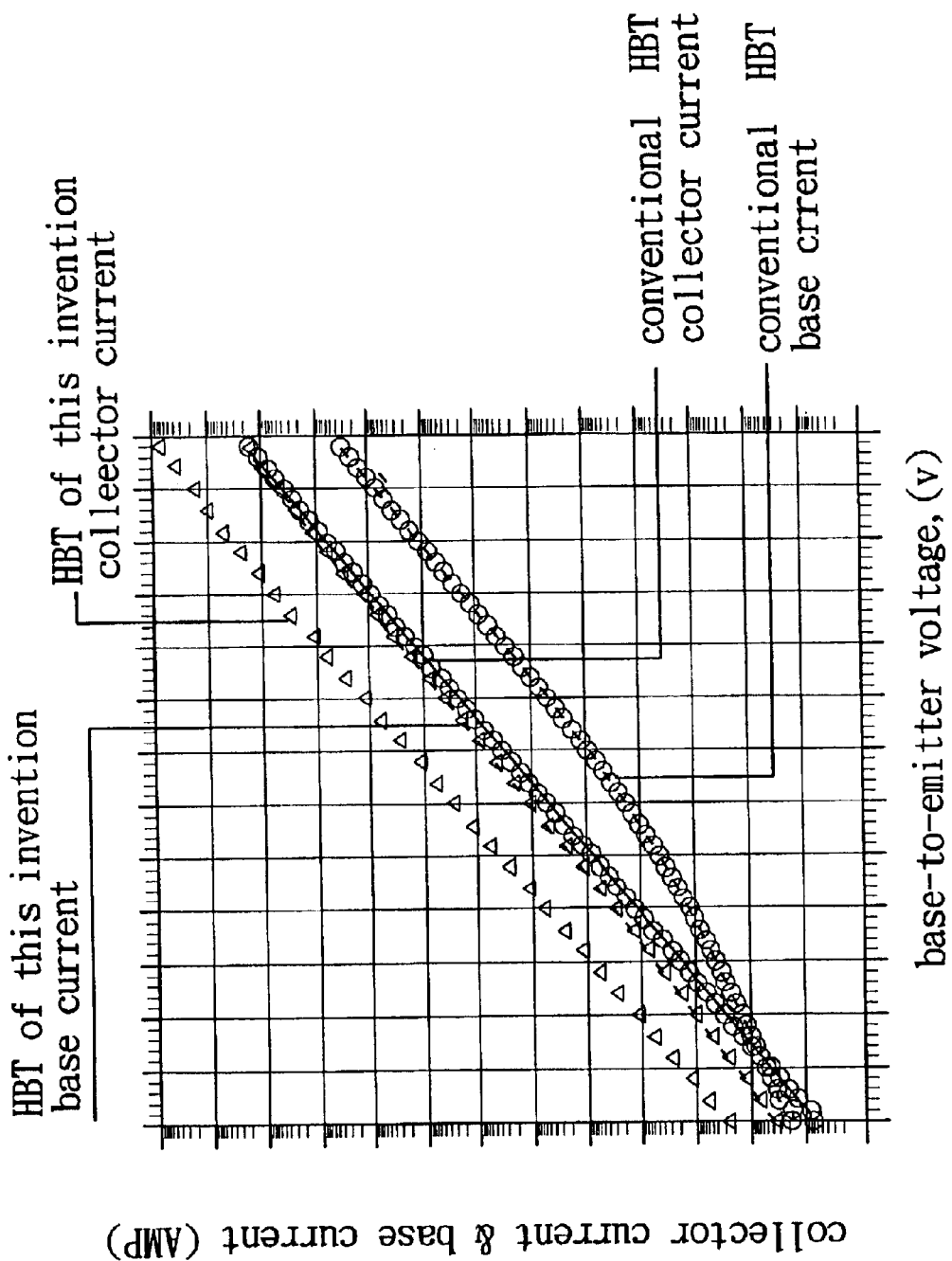
FIG. 7 is an I–V characteristics diagram showing collector current and base current versus base-to-emitter voltage for the HBT of the preferred embodiment of this invention and the conventional HBT.

FIG. 7 is an I–V characteristics diagram for comparing the collector current and the base current of the HBT 3 of the preferred embodiment of this invention with those of the conventional InGaP/GaAs HBT under different base-to-emitter voltages. The HBT 3 of this invention exhibits a higher base current and a higher collector current than those of the conventional HBT. When the turn-on voltage is defined as the base-to-emitter voltage at which the collector current reaches one $\mu A$, the HBT 3 of this invention has a turn-on voltage of about 1.2V, while the conventional HBT has a higher turn-on voltage (about 1.3V).

Figure 8:
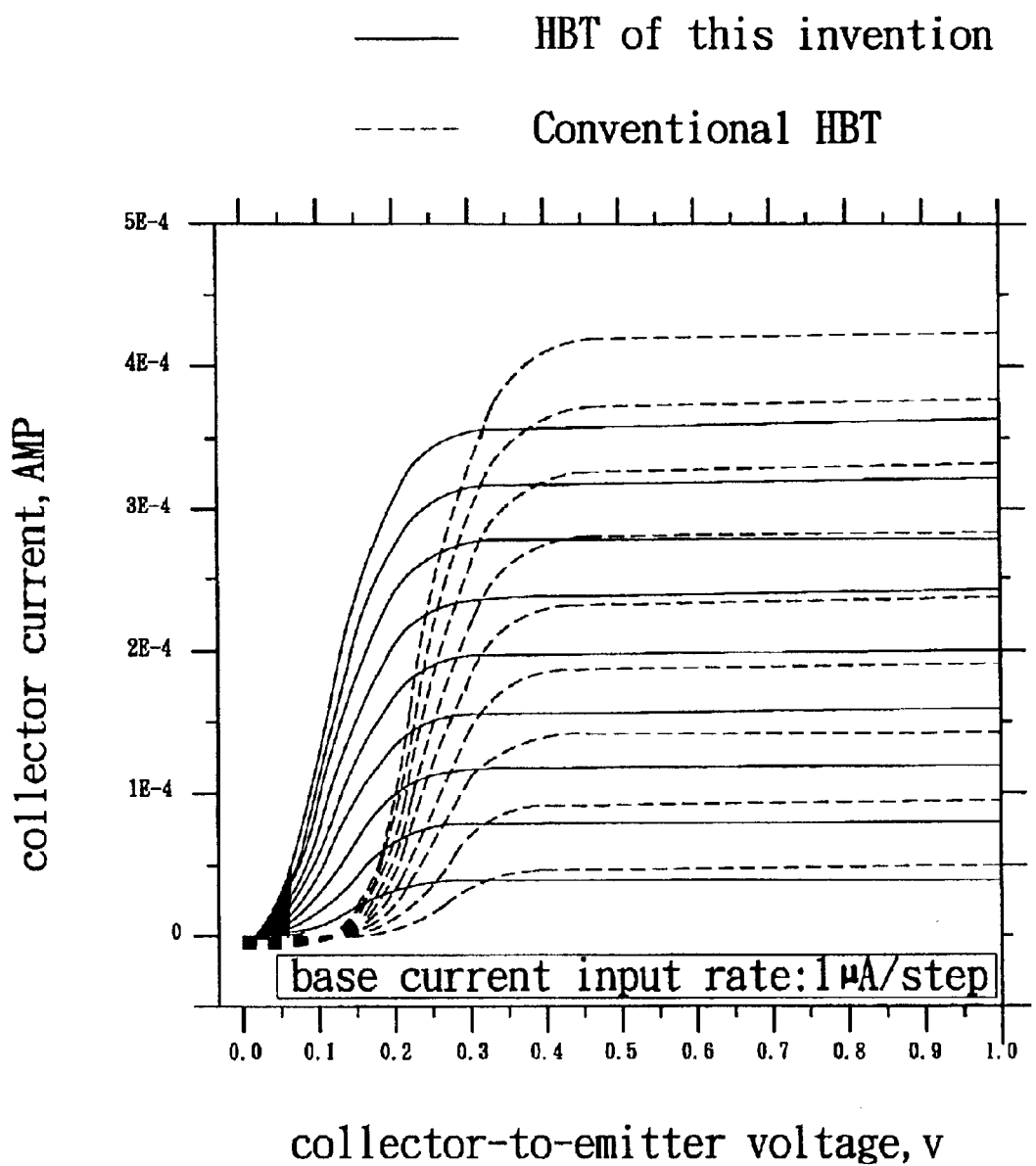
FIG. 8 is an I–V characteristics diagram showing collector current versus collector-to-emitter voltage for the HBT of the preferred embodiment of this invention and the conventional HBT.

FIG. 8 is an I–V characteristics diagram for comparing the collector-to-emitter voltage of the HBT 3 of the preferred embodiment of this invention with that of the conventional InGaP/GaAs HBT under step changes in the base current (the input rate is about 1 $\mu A$/step). The HBT 3 of this invention exhibits a lower knee voltage (about 0.25V), at which the collector current stops increasing, than those of the conventional HBT (about 0.4V).

With the inclusion of the first and second transition layers 35, 37 in the HBT of this invention, the aforesaid drawbacks resulting from the presence of the conduction band discontinuity as encountered in the prior art can be eliminated.

With the invention thus explained, it is apparent that various modifications and variations can be made without departing from the spirit of the present invention.

We claim:

1. A heterojunction bipolar transistor comprising:
   a collector;
   a base layer formed on said collector;
   a first transition layer formed on said base layer;
   an emitter layer formed on said first transition layer;
   a second transition layer formed on said emitter layer; and
   an emitter cap layer formed on said second transition layer;
   wherein each of said first and second transition layers is formed of a composition that contains an element; and
   wherein said element of said composition of said first transition layer varies decreasingly in mole fraction from one side of said first transition layer, which is adjacent to said emitter layer, to an opposite side of said first transition layer, which is adjacent to said base layer, and said element of said composition of said second transition layer varies decreasingly in mole fraction from one side of said second transition layer, which is adjacent to said emitter layer, to an opposite side of said second transition layer, which is adjacent to said emitter cap layer, so as to form a continuous conduction band from said base layer, through said first transition layer, said emitter layer and said second transition layer, to said emitter cap layer.

2. The heterojunction bipolar transistor of claim 1, wherein said base layer is made from GaAs, said emitter layer is made from GaInP, said emitter cap layer is made from GaAs, and said first and second transition layers are made from $Al_XGa_{1-X}As$, in which X is the mole fraction of Aluminum that defines the mole fraction of said element of said composition.

3. The heterojunction bipolar transistor of claim 2, wherein the mole fraction (X) is linearly graded from 0.11 to about zero from said one side of said first transition layer to said opposite side of said first transition layer and from said one side of said second transition layer to said opposite side of said second transition layer.

4. The heterojunction bipolar transistor of claim 2, wherein the mole fraction (X) is non-linearly graded from 0.11 to about zero from said one side of said first transition layer to said opposite side of said first transition layer and from said one side of said second transition layer to said opposite side of said second transition layer.

5. The heterojunction bipolar transistor of claim 2, wherein said base layer has a thickness ranging from 10 to 300 nm, and is p-type GaAs with a dopant concentration ranging from $1\times10^{18}$ to $9\times10^{19}$ cm$^{-3}$.

6. The heterojunction bipolar transistor of claim 5, wherein said first transition layer has a thickness ranging from 1 to 100 nm, and is n-type AlGaAs with a dopant concentration ranging from $1\times10^{17}$ to $9\times10^{18}$ cm$^{-3}$.

7. The heterojunction bipolar transistor of claim 6, wherein said emitter layer has a thickness ranging from 10 to 1000 nm, and is n-type InGaP with a dopant concentration ranging from $1\times10^{17}$ to $9\times10^{18}$ cm$^{-3}$.

8. The heterojunction bipolar transistor of claim 7, wherein said second transition layer has a thickness ranging from 1 to 100 nm, and is n-type AlGaAs with a dopant concentration ranging from $1\times10^{17}$ to $9\times10^{18}$ cm$^{-3}$.

9. The heterojunction bipolar transistor of claim 8, wherein said emitter cap layer has a thickness ranging from 10 to 1000 nm, and is n-type GaAs with a dopant concentration ranging from $1\times10^{17}$ to $9\times10^{19}$ cm$^{-3}$.

10. The heterojunction bipolar transistor of claim 9, wherein the mole fraction (X) is linearly graded from 0.11 to about zero from said one side of said first transition layer to said opposite side of said first transition layer and from said one side of said second transition layer to said opposite side of said second transition layer.

11. The heterojunction bipolar transistor of claim 9, wherein the mole fraction (X) is non-linearly graded from 0.11 to about zero from said one side of said first transition layer to said opposite side of said first transition layer and from said one side of said second transition layer to said opposite side of said second transition layer.

12. The heterojunction bipolar transistor of claim 2, further comprising a semi-insulating substrate layer, and a buffer layer formed on said substrate, said collector layer being formed on said buffer layer.

13. The heterojunction bipolar transistor of claim 12, wherein each of said substrate layer, said buffer layer, and said collector layer is made from GaAs.

14. The heterojunction bipolar transistor of claim 13, wherein said substrate layer is n-type GaAs.

15. The heterojunction bipolar transistor of claim 14, wherein said buffer layer has a thickness ranging from 10 to 1000 nm, and is n-type GaAs with a dopant concentration ranging from $1\times10^{16}$ to $5\times10^{19}$ cm$^{-3}$.

16. The heterojunction bipolar transistor of claim 15, wherein said collector layer has a thickness ranging from 100 to 1000 nm, and is n-type GaAs with a dopant concentration ranging from $1\times10^{16}$ to $5\times10^{17}$ cm$^{-3}$.

* * * * *